United States Patent
Dreps

(10) Patent No.: US 8,089,813 B2
(45) Date of Patent: Jan. 3, 2012

(54) CONTROLLABLE VOLTAGE REFERENCE DRIVER FOR A MEMORY SYSTEM

(75) Inventor: Daniel M. Dreps, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 721 days.

(21) Appl. No.: 12/175,555

(22) Filed: Jul. 18, 2008

(65) Prior Publication Data

US 2010/0013454 A1    Jan. 21, 2010

(51) Int. Cl.
    *G11C 16/06* (2006.01)
(52) U.S. Cl. .................................................. 365/185.2
(58) Field of Classification Search .......... 323/313–317; 327/535, 537, 538, 543; 365/185.2, 185.23, 365/185.24, 189.09
    See application file for complete search history.

(56) References Cited

U.S. PATENT DOCUMENTS

| | | | |
|---|---|---|---|
| 5,272,432 A | 12/1993 | Nguyen et al. | |
| 5,513,135 A | 4/1996 | Dell et al. | |
| 5,666,078 A | 9/1997 | Lamphier et al. | |
| 5,687,330 A | 11/1997 | Gist et al. | |
| 5,739,681 A | 4/1998 | Allman | |
| 6,133,749 A | 10/2000 | Hansen et al. | |
| 6,177,785 B1 | 1/2001 | Lee | |
| 6,208,127 B1 | 3/2001 | Doluca | |
| 6,381,685 B2 | 4/2002 | Dell et al. | |
| 6,426,671 B1 | 7/2002 | Kono | |
| 6,449,208 B1 * | 9/2002 | Kono et al. .................. 365/226 |
| 6,449,676 B1 | 9/2002 | Johari et al. | |
| 6,587,896 B1 | 7/2003 | Baldwin et al. | |
| 6,801,025 B2 | 10/2004 | Carballo et al. | |
| 6,992,473 B2 | 1/2006 | Marschalkowski et al. | |
| 7,038,498 B2 | 5/2006 | Funaba | |
| 7,180,386 B2 | 2/2007 | Thompson et al. | |
| 7,194,559 B2 | 3/2007 | Salmon et al. | |
| 7,208,972 B2 * | 4/2007 | Dreps et al. .................. 326/26 |
| 7,218,084 B2 | 5/2007 | Pons et al. | |
| 7,336,058 B1 | 2/2008 | Lo et al. | |
| 7,750,726 B2 * | 7/2010 | Fujisawa et al. ............ 327/538 |
| 2004/0263143 A1 | 12/2004 | Lee | |
| 2004/0264256 A1 | 12/2004 | Mauritz et al. | |
| 2004/0268161 A1 | 12/2004 | Ross | |
| 2006/0274595 A1 | 12/2006 | Byeon et al. | |
| 2008/0054935 A1 | 3/2008 | Pan | |
| 2008/0203987 A1 * | 8/2008 | Lee .............................. 323/282 |
| 2009/0206952 A1 | 8/2009 | Dreps et al. | |

OTHER PUBLICATIONS

Daniel M. Dreps, et al., U.S. Appl. No. 12/030,946, filed Feb. 14, 2008; "Delay Line Regulation Using High-Frequency Micro-Regulators".

* cited by examiner

*Primary Examiner* — Matthew Nguyen
(74) *Attorney, Agent, or Firm* — Cantor Colburn LLP

(57) ABSTRACT

A voltage reference driver includes a voltage divider circuit with a voltage reference output node to output a voltage between a first voltage and a second voltage. The voltage reference driver also includes a first selectable impedance circuit coupled to a node at the first voltage and further coupled to the voltage reference output node, and a second selectable impedance circuit coupled to a node at the second voltage and further coupled to the voltage reference output node. Combinations of the first selectable impedance circuit and the second selectable impedance circuit are selectable such that a constant impedance is maintained at the voltage reference output node within a threshold value.

24 Claims, 7 Drawing Sheets

US 8,089,813 B2

CONTROLLABLE VOLTAGE REFERENCE DRIVER FOR A MEMORY SYSTEM

BACKGROUND

This invention relates generally to computer memory systems, and more particularly to a controllable voltage reference driver for a memory system.

Contemporary high performance computing main memory systems are generally composed of one or more dynamic random access memory (DRAM) devices, which are connected to one or more processors via one or more memory control elements. Overall computer system performance is affected by each of the key elements of the computer structure, including the performance/structure of the processor(s), any memory cache(s), the input/output (I/O) subsystem(s), the efficiency of the memory control function(s), the main memory device(s), and the type and structure of the memory interconnect interface(s).

Extensive research and development efforts are invested by the industry, on an ongoing basis, to create improved and/or innovative solutions to maximizing overall system performance and density by improving the memory system/subsystem design and/or structure. High-availability systems present further challenges as related to overall system reliability due to customer expectations that new computer systems will markedly surpass existing systems in regard to mean-time-between-failure (MTBF), in addition to offering additional functions, increased performance, increased storage, lower operating costs, etc. Other frequent customer requirements further exacerbate the memory system design challenges, and include such items as ease of upgrade and reduced system environmental impact (such as space, power and cooling).

DRAM devices may use a voltage reference supplied from a fixed external resistor or an on-board power supply as reference for read and/or write operations.

SUMMARY

An exemplary embodiment is a voltage reference driver that includes a voltage divider circuit with a voltage reference output node to output a voltage between a first voltage and a second voltage. The voltage reference driver also includes a first selectable impedance circuit coupled to a node at the first voltage and further coupled to the voltage reference output node, and a second selectable impedance circuit coupled to a node at the second voltage and further coupled to the voltage reference output node. Combinations of the first selectable impedance circuit and the second selectable impedance circuit are selectable such that a constant impedance is maintained at the voltage reference output node within a threshold value.

Another exemplary embodiment is a system that includes one or more memory devices, control logic, and a memory interface device in communication with the one or more memory devices via a physical interface. The physical interface includes a voltage reference driver with a voltage divider circuit. The voltage divider circuit provides a voltage reference output node to output a voltage between a first voltage and a second voltage. The voltage reference driver also includes a first selectable impedance circuit coupled to a node at the first voltage and further coupled to the voltage reference output node. Additionally, the voltage reference driver includes a second selectable impedance circuit coupled to a node at the second voltage and further coupled to the voltage reference output node. The combinations of the first selectable impedance circuit and the second selectable impedance circuit are selectable such that a constant impedance is maintained at the voltage reference output node within a threshold value.

A further exemplary embodiment is method for controlling a voltage reference driver in a memory system. The method includes determining a desired value of a voltage reference for one or more memory devices in the memory system, and configuring mode controls to selectively enable and disable a plurality of selectable impedance circuits coupled to a voltage divider circuit. The voltage divider circuit is further coupled to a voltage reference output node to output the voltage reference. Constant impedance is maintained at the voltage reference output node within a threshold value in response to the configuring.

An additional exemplary embodiment is a design structure tangibly embodied in a machine-readable medium for designing, manufacturing, or testing an integrated circuit. The design structure includes a voltage divider circuit with a voltage reference output node to output a voltage between a first voltage and a second voltage. The design structure also includes a first selectable impedance circuit coupled to a node at the first voltage and further coupled to the voltage reference output node. The design structure further includes a second selectable impedance circuit coupled to a node at the second voltage and further coupled to the voltage reference output node. Combinations of the first selectable impedance circuit and the second selectable impedance circuit are selectable such that a constant impedance is maintained at the voltage reference output node within a threshold value.

Other systems, methods, apparatuses, design structures and/or computer program products according to embodiments will be or become apparent to one with skill in the art upon review of the following drawings and detailed description. It is intended that all such additional systems, methods, apparatuses, design structures and/or computer program products be included within this description, be within the scope of the present invention, and be protected by the accompanying claims.

BRIEF DESCRIPTION OF THE SEVERAL VIEWS OF THE DRAWINGS

Referring now to the drawings wherein like elements are numbered alike in the several FIGURES.

DETAILED DESCRIPTION

The invention as described herein controls a voltage reference driver of memory interface in a memory system. As multiple generations of double-data-rate (DDR) synchronous dynamic random access memory (SDRAM) devices have been developed, each generation has different power supply requirements. For example, the power supply requirements for various generations of DDR SDRAM are: 1.8 Volts for DDR2, 1.5 Volts for DDR3, 1.35 Volts for DDR3+, and 1.2 Volts for DDR4. A memory interface device that controls access to memory devices is constrained in size and power, particularly when integrated onto a dual inline memory module (DIMM) along with memory devices. Memory devices use a variety of signal types to read and write data, with different optimal impedances, e.g., single ended and/or differential interfaces with different loading characteristics. There may be variations in memory system interconnections and devices that result in a non-optimal performance for read and write operations. A voltage reference can be used to establish a transition level, where variations of voltage reference affect the absolute voltage a signal has to reach to achieve a valid high or low level and therefore the time to which setup and hold is measured. In an exemplary embodiment, a configurable voltage reference driver is provided to allow software and/or firmware to adjust the voltage reference to an optimum position to align data strobes with near peak values within the data-eye. The optimization allows the overall amplitude of the data-eye to be reduced to lower voltages while maintaining reliable signal sampling.

In an exemplary embodiment, a memory interface device includes circuitry configured to support multiple memory device input/output (I/O) voltages from which the voltage reference is derived while maintaining a fixed source impedance within a tolerance. The memory interface device can be implemented in a memory hub device or memory controller with multiple ports that are configurable to interface directly with one or more ranks of memory devices and registers of industry-standard registered dual in-line memory modules (RDIMMs). Interposing a memory hub device as a memory interface device between a memory controller and memory devices enables a flexible high-speed protocol with error detection to be implemented. Additional features are described in greater detail herein.

Figure 1:
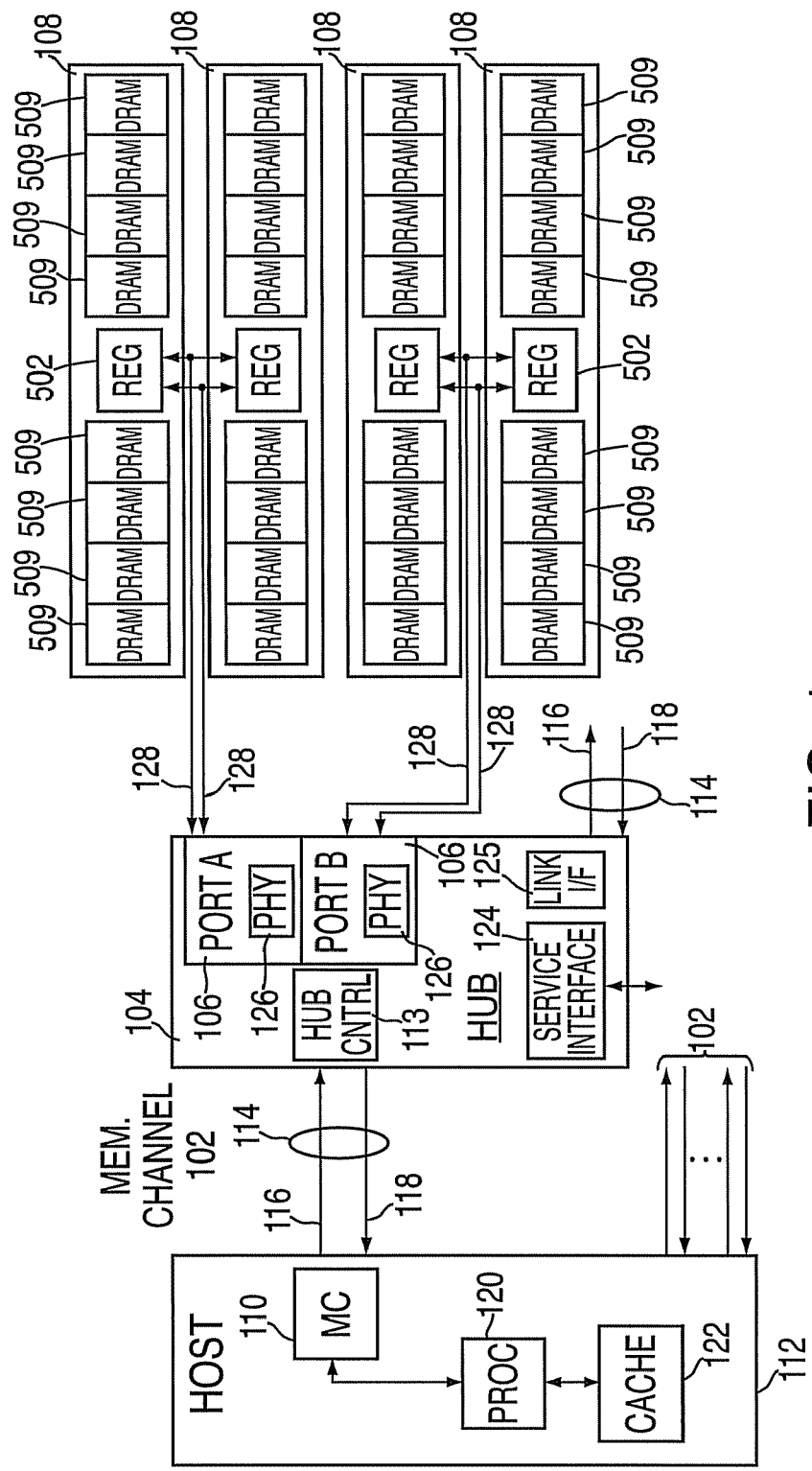
FIG. 1 depicts a memory system interfacing with multiple registered dual in-line memory modules (RDIMMs) communicating via high-speed upstream and downstream links that may be implemented by exemplary embodiments.

Turning now to FIG. 1, an example of a memory system 100 that includes one or more host memory channels 102 each connected to one or more cascaded memory hub devices 104 is depicted in a planar configuration. Each memory hub device 104 may include two synchronous dynamic random access memory (SDRAM) ports (port A and port B) 106 connected to zero, one or two industry-standard RDIMMs 108. For example, the RDIMMs 108 can utilize multiple memory devices 509, such as a version of double data rate (DDR) dynamic random access memory (DRAM), e.g., DDR1, DDR2, DDR3, DDR4, etc. In an exemplary embodiment, the memory devices 509 are DDR3 synchronous DRAMs that interface to ports A and B 106 via register/phase locked loop (PLL) devices 502 to locally control address and control signal timing on the RDIMMs 108. The memory channel 102 carries information to and from a memory controller 110 in host processing system 112. The memory channel 102 may transfer data at rates upwards of 6.4 Gigabits per second. The hub control logic 113 in the memory hub device 104 can translate the information from a high-speed reduced pin count bus 114 which enables communication to and from the memory controller 110 of the host processing system 112 to lower speed, wide, bidirectional ports 106 to support low-cost industry standard memory, thus the memory hub device 104 and the memory controller 110 are both generically referred to as communication interface devices or memory interface devices. The bus 114 includes downstream link segments 116 and upstream link segments 118 as unidirectional links between devices in communication over the bus 114. The term "downstream" indicates that the data is moving from the host processing system 112 to the memory devices of the RDIMMs 108. The term "upstream" refers to data moving from the memory devices of the RDIMMs 108 to the host processing system 112. The information stream coming from the host processing system 112 can include of a mixture of commands and data to be stored in the RDIMMs 108 and redundancy information, which allows for reliable transfers. The information returning to the host processing system 112 can include data retrieved from the memory devices on the RDIMMs 108, as well as redundant information for reliable transfers. Commands and data can be initiated in the host processing system 112 using processing elements known in the art, such as one or more processors 120 and cache memory 122. The memory hub device 104 can also include additional communication interfaces, for instance, a service interface 124 to initiate special test modes of operation that may assist in configuring and testing the memory hub device 104.

In an exemplary embodiment, the memory controller 110 has a very wide, high bandwidth connection to one or more processing cores of the processor 120 and cache memory 122. This enables the memory controller 110 to monitor both actual and predicted future data requests to the memory channel 102. Based on the current and predicted processor 120 and cache memory 122 activity, the memory controller 110 determines a sequence of commands to best utilize the attached memory resources to service the demands of the processor 120 and cache memory 122. This stream of commands is mixed together with data that is written to the memory devices of the RDIMMs 108 in units called "frames". The memory hub device 104 interprets the frames as formatted by the memory controller 110 and translates the contents of the frames into a format compatible with the RDIMMs 108.

Although only a single memory channel 102 is depicted in detail in FIG. 1 connecting the memory controller 110 to a single memory device hub 104, systems produced with this configuration may include more than one discrete memory channel 102 from the memory controller 110, with each of the memory channels 102 operated singly (when a single channel is populated with modules) or in parallel (when two or more channels are populated with modules) to achieve the desired system functionality and/or performance. Moreover, any number of lanes can be included in the bus 114, where a lane includes link segments that can span multiple cascaded memory hub devices 104. For example, the downstream link segments 116 can include 13 bit lanes, 2 spare lanes and a clock lane, while the upstream link segments 118 may include 20 bit lanes, 2 spare lanes and a clock lane. To reduce susceptibility to noise and other coupling interference, low-voltage differential-ended signaling may be used for all bit lanes of the bus 114, including one or more differential-ended clocks. Both the memory controller 110 and the memory hub device 104 contain numerous features designed to manage the redundant resources, which can be invoked in the event of hardware failures. For example, multiple spare lanes of the bus 114 can be used to replace one or more failed data or clock lane in the upstream and downstream directions.

In one embodiment, one of the spares can be used to replace either a data or clock link, while a second spare is used to repair a data link but not a clock link. This maximizes the ability to survive multiple interconnect hard failures. Additionally, one or more of the spare lanes can be used to test for transient failures or establish bit error rates. The spare lanes are tested and aligned during initialization but are deactivated during normal run-time operation. The channel frame format, error detection and protocols are the same before and after spare lane invocation. A link interface 125 can be used to manage lane selection and flow of information on the bus 114.

In order to allow larger memory configurations than could be achieved with the pins available on a single memory hub device 104, the memory channel protocol implemented in the memory system 100 allows for the memory hub devices to be cascaded together. Memory hub device 104 contains buffer elements in the downstream and upstream directions so that the flow of data can be averaged and optimized across the high-speed memory channel 102 to the host processing system 112.

Memory hub devices 104 include support for the separate out-of-band service interface 124, as depicted in FIG. 1, which can be used for advanced diagnostic and testing purposes. For example, the service interface 124 can be used to configure memory interface parameters in physical interfaces (PHYs) 126 of ports A and B 106. The PHYs 126 provide voltage and establish impedances for a variety of interconnections with the RDIMMs 108 and the memory devices 509. Data, data strobes, command, address, and voltage references are examples of signal types driven between the PHYs 126 and the RDIMMs 108 via connections 128.

Figure 2:
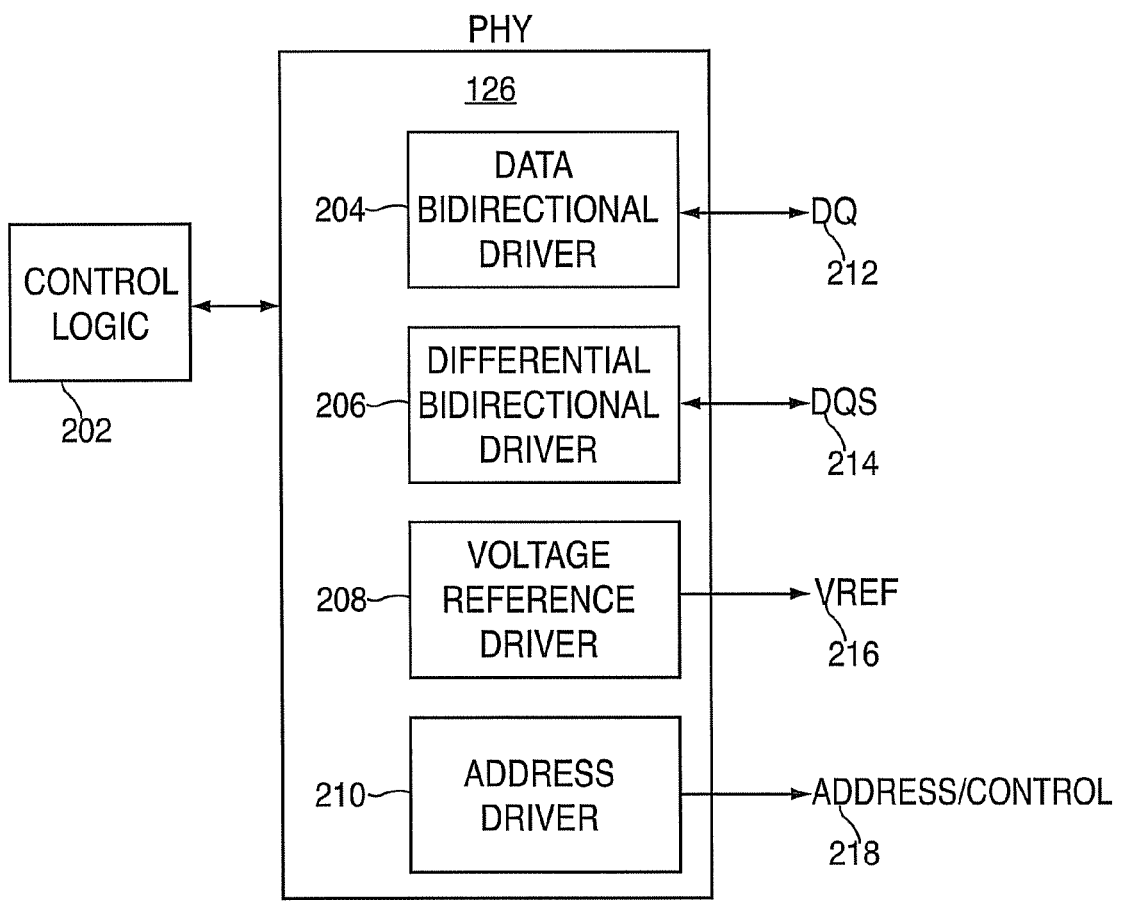
FIG. 2 depicts a memory interface for interfacing with memory devices or subsystems that may be implemented by exemplary embodiments.

FIG. 2 depicts an exemplary embodiment of one of the PHYs 126 of FIG. 1 interfaced to control logic 202. The PHY 126 may include a data bidirectional driver 204, a differential bidirectional driver 206, a voltage reference driver 208, and an address driver 210. The data bidirectional driver 204 controls reading and writing of data on data lines DQ 212. In an exemplary embodiment, there are 72 DQs 212 to interface with memory devices 509 of FIG. 1. The voltage on the DQs 212 can vary as a function of the type of interfaced memory device 509, e.g. DDR2, DDR3, DDR4, etc. The differential bidirectional driver 206 provides strobes DQS 214 for timing the reading and writing of data on DQ 212. The timing of the strobes DQS 214 can be adjusted in the differential bidirectional driver 206 as commanded by the control logic 202. In an exemplary embodiment, there are 18 differential DQS 214 to interface with memory devices 509 of FIG. 1. Individual DQS 214 differential pairs can be grouped with multiple DQ 212 lines to perform multi-bit transactions per strobe. The voltage reference driver 208 drives voltage reference lines VREF 216, which may be used by the memory devices 509 to establish a voltage level that a signal has to reach to achieve a valid high or low level, e.g., levels for the DQ 212. There may be multiple VREFs 216 per PHY 126. The address driver 210 can drive multiple address and control lines address/control 218 to the register/PLL devices 502 and/or to memory devices 509 of FIG. 1. The control logic 202 can be implemented in software, firmware, and/or hardware to control configuration settings of the drivers 204-210. For example, the control logic 202 can represent configuration firmware executed on the host processing system 112 as part of initialization and transmitted to the PHY 126 via service interface 124. Although single drivers 204-210 are depicted in FIG. 2, it will be understood that the drivers 204-210 can be combined in any combination or further subdivided; for instance, separate drivers 204-210 per bit can be implemented within the scope of the invention. Additional connections that are not depicted can also exist between the elements in PHY 126, as well as connections to other elements of the ports 106 and in the memory hub device 104 of FIG. 1.

Figure 3:
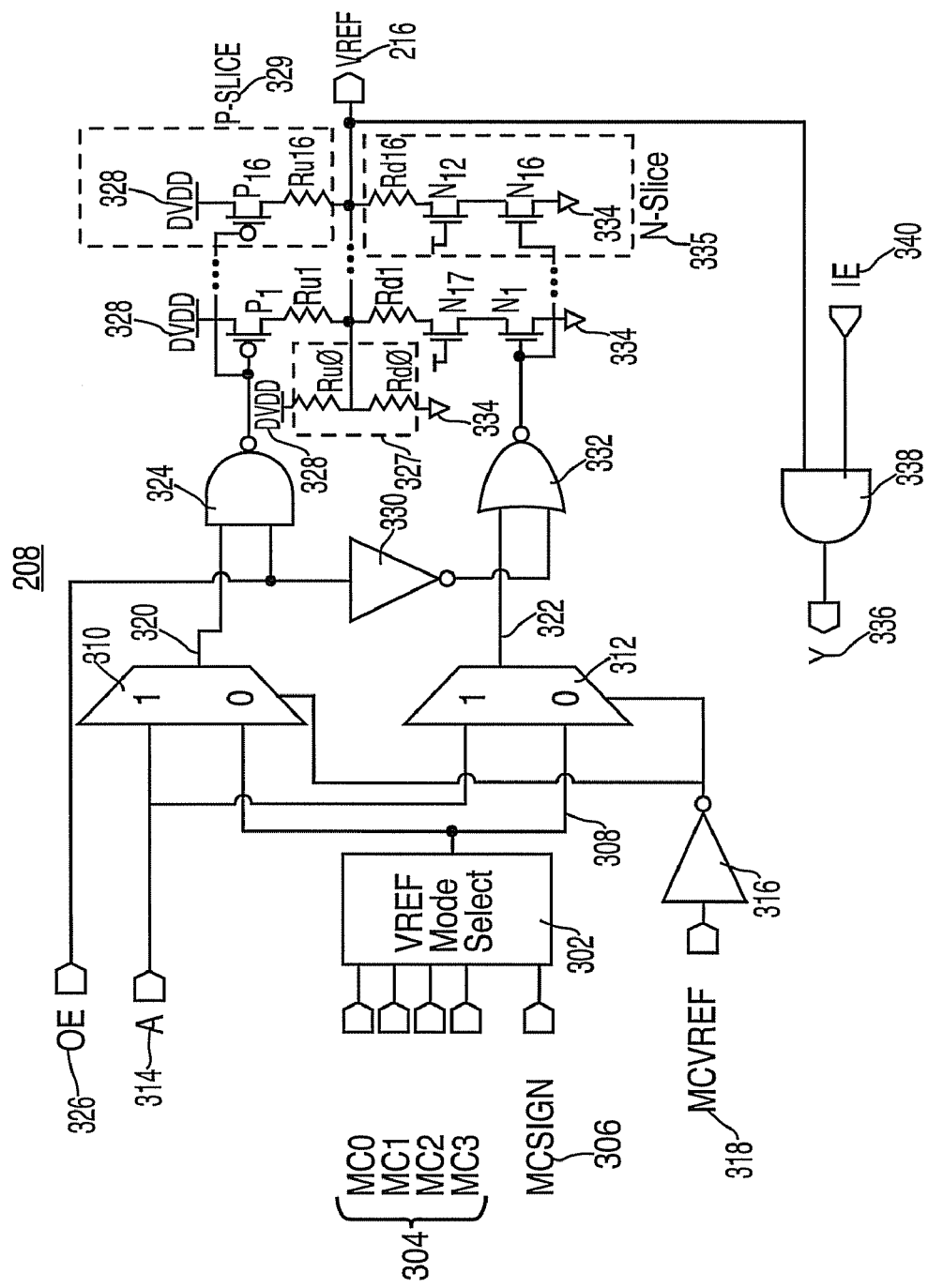
FIG. 3 depicts a configurable voltage reference driver for interfacing with memory devices or subsystems that may be implemented by exemplary embodiments.

FIG. 3 depicts an embodiment of the voltage reference driver 208 for interfacing directly or indirectly with the memory devices 509 of FIG. 1. The voltage reference driver 208 includes a VREF mode selector 302 for configuring circuitry of the voltage reference driver 208 to adjust the voltage level of VREF 216. The VREF mode selector 302 receives multiple mode controls (e.g., MC0, MC1, MC2 and MC3) 304 and mode control sign (MCSIGN) 306. The VREF mode selector 302 can employ a decoder to convert the inputs into separate select/enable signals to output. The VREF mode selector 302 may output a vector of multiple signals on bus 308 in response to the mode controls 304 and MCSIGN 306. In an exemplary embodiment, the bus 308 includes select/enable signals to individually control switching of p-channel field effect transistors (P-FETs) P1-P16 and n-channel field effect transistors (N-FETs) N1-N16. In alternate embodiments, different numbers of P-FETs and N-FETs can be switched in response to outputs on the bus 308. The bus 308 is routed to multiplexers (muxes) 310 and 312. Muxes 310 and 312 also receive input A 314 and select between input A 314 and bus 308 based on the output of inverter 316, which inverts the value of MCVREF 318. Thus, if MCVREF 318 is a logical "1", mux 310 outputs values from bus 308 on node 320 and mux 312 outputs values from bus 308 on node 322; otherwise, mux 310 outputs the value of input A 314 on node 320 and mux 312 outputs the value of input A 314 on node 322.

In an exemplary embodiment, node 320 is coupled to NAND-gate 324, which also receives output enable (OE) 326 and outputs gating control to P1-P16. When the P-FETs P1-P16 are enabled, current flows from digital voltage (DVDD) 328 through resistors Ru1-Ru16. Each P-FET and resistor pair, such as P1 in combination with Ru1 or P16 in combination with Ru16, is also referred to as a P-slice selectable impedance circuit (P-slice) 329. There can be any number of P-slices 329 that are independently controllable to modify the voltage of VREF 216. OE 326 is also coupled to inverter 330, which is further coupled to an input of NOR-gate 332. NOR-gate 332 is also coupled to node 322 and outputs gating control to N1-N16. When N1-N16 are enabled, current can flow between VREF 216, resistors Rd1-Rd16, through N-FETs N17-N32, through N-FETs N1-N16 to ground 334. Each group series of N-FETs and resistors, such as N1, N17 and Rd1 or N16, N32 and Rd16, may also be referred to as an N-slice selectable impedance circuit (N-slice) 335. Gates of the N-FETs N17-N32 can be used to enable or buffer the N-slices 335 and can be coupled to a modifiable input or tied a voltage source, such as DVDD 328 to always be enabled. In an alternate embodiment, N-FETs N17-N32 are omitted. Each N-slice 335 can be independently enabled via the N-FETs N1-N16 relative to each other and relative to the P-slices 329.

The output of VREF 216 can be monitored as a feedback value Y 336, which may be monitored by the control logic 202 of FIG. 2 for testing and calibration. The feedback value Y 336 can be gated using an AND-gate as controlled using input enable (IE) 340. Thus, if IE 340 is a logical "0", then the feedback value Y 336 is 0, and when IE 340 is a logical "1", then the feedback value Y 336 may be equivalent to VREF 216 depending upon the gating threshold voltage of the AND-gate 338. It will be understood that this feedback portion of the voltage reference driver 208, as well as other test functions of the voltage reference driver 208, can be omitted within the scope of the invention. For example, input A 314 and muxes 310 and 312 may be omitted, with bus 308 routed directly to gates 324 and 332 in an alternate embodiment.

VREF 216 (also referred to as "voltage reference output node") is also coupled to a pair of fixed value resistors Ru0 and Rd0 as a voltage divider circuit 327, where Ru0 is further coupled to DVDD 328 (also referred to as an "upward impedance") and Rd0 is further coupled to ground 334 (also referred to as an "downward impedance"). As various P-slices 329 and N-slices 335 are enabled in conjunction with the fixed value resistors Ru0 and Rd0, the voltage at VREF 216 is adjusted. In an exemplary embodiment, the resistance values of Ru0 and Rd0 are the same, defaulting VREF 216 to about half of the voltage DVDD 328 when no P-slices 329 or N-slices 335 are active. As P-slices 329 and/or N-slices 335 are enabled, the voltage of VREF 216 is shifted off center relative to DVDD 328. DVDD 328 can also vary in voltage, for example, DVDD 328 may be 1.5 Volts, 1.35 Volts, or 1.2 Volts, with VREF 216 tracking relative to the voltage of DVDD 328. Table 1 provides an example truth table for mapping inputs to the voltage reference driver 208 to values of VREF 216. The values of VREF 216 listed in table 1 can be achieved through the combined VREF mode select 302 enabling P-slices 329 and/or N-slices 335 along with the gates 324 and 332, muxes 310 and 312 and inverters 316 and 330.

TABLE 1

Example truth table for voltage reference driver configuration

| MC0 | MC1 | MC2 | MC3 | MCSIGN | MCVREF | OE | VREF |
|---|---|---|---|---|---|---|---|
| — | — | — | — | — | — | 0 | Hi-Z |
| — | — | — | — | — | 0 | 1 | A |
| 0 | 0 | 0 | 0 | 0 | 1 | 1 | 0.5 * DVDD |
| 0 | 0 | 0 | 0 | 1 | 1 | 1 | 0.4875 * DVDD |
| 1 | 0 | 0 | 0 | 1 | 1 | 1 | 0.475 * DVDD |
| 0 | 1 | 0 | 0 | 1 | 1 | 1 | 0.462 * DVDD |
| 1 | 1 | 0 | 0 | 1 | 1 | 1 | 0.45 * DVDD |
| 0 | 0 | 1 | 0 | 1 | 1 | 1 | 0.4375 * DVDD |
| 1 | 0 | 1 | 0 | 1 | 1 | 1 | 0.425 * DVDD |
| 0 | 1 | 1 | 0 | 1 | 1 | 1 | 0.4125 * DVDD |
| 1 | 1 | 1 | 0 | 1 | 1 | 1 | 0.4 * DVDD |
| 0 | 0 | 0 | 1 | 0 | 1 | 1 | 0.5125 * DVDD |
| 1 | 0 | 0 | 1 | 0 | 1 | 1 | 0.525 * DVDD |
| 0 | 1 | 0 | 1 | 0 | 1 | 1 | 0.5375 * DVDD |
| 1 | 1 | 0 | 1 | 0 | 1 | 1 | 0.55 * DVDD |
| 0 | 0 | 1 | 1 | 0 | 1 | 1 | 0.5625 * DVDD |
| 1 | 0 | 1 | 1 | 0 | 1 | 1 | 0.575 * DVDD |
| 0 | 1 | 1 | 1 | 0 | 1 | 1 | 0.5875 * DVDD |
| 1 | 1 | 1 | 1 | 0 | 1 | 1 | 0.6 * DVDD |
| — | — | — | 1 | 1 | 1 | 1 | Test Mode |
| — | — | — | 0 | 0 | 1 | 1 | Unused |

In an exemplary embodiment, the resistors Ru0-Ru16 and Rd0-Rd16 are polycrystalline silicon resistors, providing a minimal shift in resistance over a range of temperatures, for example, about a 1% change in resistance over a temperature range of 0 to 125 degrees Celsius. Process variations may result in a 5% shift over the temperature range, but this can be reduced using firmware calibration as a function of temperature. By balancing the impedance both with respect to DVDD 328 and ground 334, the VREF 216 voltage can be adjusted while maintaining a nearly constant Thevinian source impedance at VREF 216. The resistors (e.g., Ru1-Ru16 and Rd1-Rd16) in the voltage reference driver 208 may account for about 80% of the impedance, while the FETs (e.g., P1-P16 and N1-32) account for about 20% of the impedance.

Figure 4:
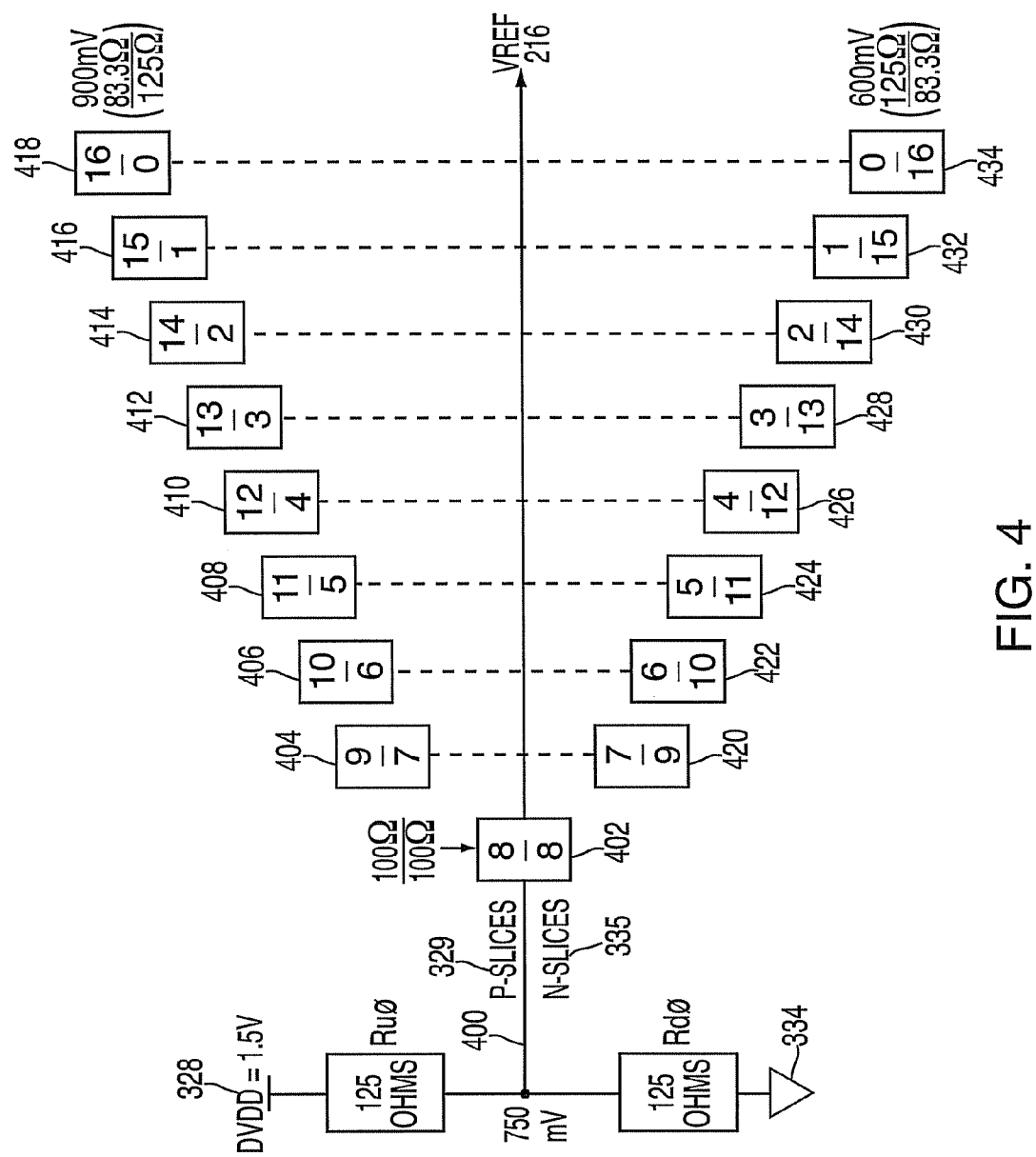
FIG. 4 depicts an example of various combinations of slices enabled to vary the voltage reference that may be implemented by exemplary embodiments.

FIG. 4 depicts an example of various combinations of P-slices 329 and N-slices 335 of FIG. 3 enabled to vary the voltage of VREF 216 while maintaining the Thevinian source impedance at VREF 216. The example in FIG. 4 uses DVDD 328 with a voltage of 1.5 Volts divided at node 400 between resistors Ru0 and Rd0 with resistance values of 125 Ohms each. In the exemplary embodiment, the node 400 is coupled to 16 P-slices 329 and 16 N-slices 335, with each P-slice 329 and N-slice 335 having an impedance of 4 kilo-Ohms. By configuring the inputs to the voltage reference driver 208, such as the mode controls 304, MCSIGN 306, MCREF 318 and OE 326 of FIG. 3 and table 1, the voltage at VREF 216 is adjusted. For example, at block 402, 8 P-slices 329 and 8 N-slices 335 are enabled, which results in a ratio of 100 Ohms/100 Ohms, where each of the 100 Ohm values is achieved by placing 8 4 kilo-Ohm impedances in parallel with 125 Ohms. This configuration results in a Thevinian source impedance at VREF 216 of 50 Ohms. As the P-slices 329 and N-slices 335 are selectively enabled and disabled, the ratio changes result in changes in voltage at VREF 216, but keeping the total number of slices enabled as a constant results in a constant Thevinian source impedance at VREF 216. For example, at block 404 there are 9 P-slices 329 enabled and 7 N-slices 335 enabled, resulting a ratio of about 97.56 Ohms/102.56 Ohms.

Changing the state of the mode controls 304 of FIG. 3 further modifies the ratio. At block 406, the ratio of P-slices 329 to N-slices 335 is 10/6. At block 408, the ratio of P-slices 329 to N-slices 335 is 11/5. At block 410, the ratio of P-slices 329 to N-slices 335 is 12/4. At block 412, the ratio of P-slices 329 to N-slices 335 is 13/3. At block 414, the ratio of P-slices 329 to N-slices 335 is 14/2. At block 416, the ratio of P-slices 329 to N-slices 335 is 15/1. At block 418, the ratio of P-slices 329 to N-slices 335 is 16/0, resulting in a VREF 216 voltage of 900 millivolts and an impedance ratio of 83.3 Ohms to 125 Ohms, while still maintaining a Thevinian source impedance of about 50 Ohms.

The voltage of VREF 216 can be lowered following an inverted pattern as described for blocks 404-418, with each step resulting in an adjustment of about one eighth of DVDD 328 (18.75 millivolts for the example of FIG. 4). At block 420, there are 7 P-slices 329 enabled and 9 N-slices 335 enabled, resulting a ratio of about 102.56 Ohms/97.56 Ohms. The pattern continues at block 422 with a 6/10 ratio, at block 424 with a 5/11 ratio, at block 426 with a 4/12 ratio, at block 428 with a 3/13 ratio, at block 430 with a 2/14 ratio, and at block 432 with a 1/15 ratio. At block 434 with a 0/16 ratio, results in a VREF 216 voltage of 600 millivolts and an impedance ratio of 125 Ohms to 83.3 Ohms, while still maintaining a Thevinian source impedance of about 50 Ohms.

Figure 5:
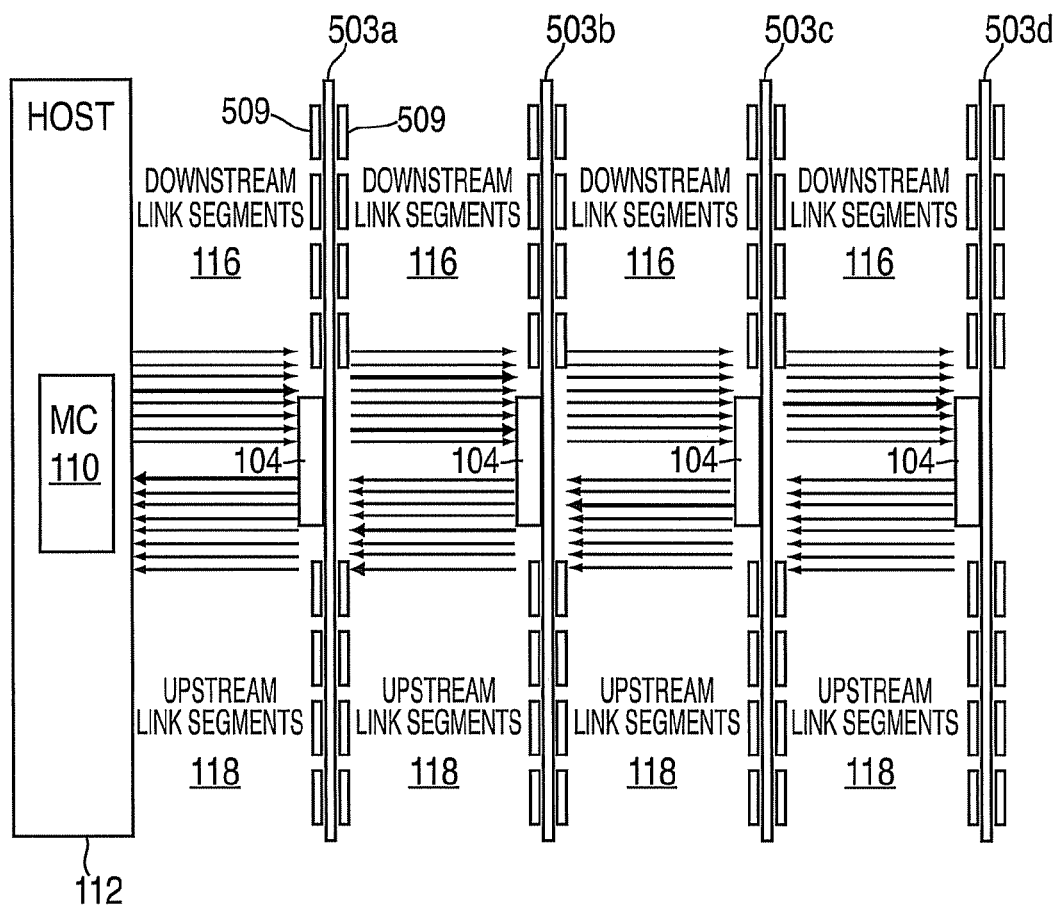
FIG. 5 depicts a cascade interconnected memory system that includes DIMMs communicating via high-speed upstream and downstream links that may be implemented by exemplary embodiments.

FIG. 5 depicts an exemplary embodiment where the memory hub devices 104 are integrated on DIMMs 503a, 503b, 503c, and 503d communicating via cascade interconnected downstream link segments 116 and upstream link segments 118. The DIMMs 503a-503d can include multiple memory devices 509, which may be DDR DRAM devices, as well as other components known in the art, e.g., resistors, capacitors, etc. The memory devices 509 are also referred to as DRAM 509 or DDRx 509, as any version of DDR may be included on the DIMMs 503a-503d, e.g., DDR2, DDR3, DDR4, etc. It can also be seen in FIG. 5 that the DIMM 503a, as well as DIMMs 503b-d may be dual sided, having memory devices 509 on both sides of the modules. Memory controller 110 in host 112 interfaces with DIMM 503a, sending commands, address and data values via the downstream link segments 116 and upstream link segments 118 that may target any of the DIMMs 503a-503d. If a DIMM receives a command that is not intended for it, the DIMM redrives the command to the next DIMM in the daisy chain (e.g., DIMM 503a redrives to DIMM 503b, DIMM 503b redrives to DIMM 503c, etc.). The memory devices 509 may be organized as one or more ranks on the DIMMs 503*a*-503*d*, e.g., stacked memory devices 509 or multiple rows per DIMM.

Figure 6:
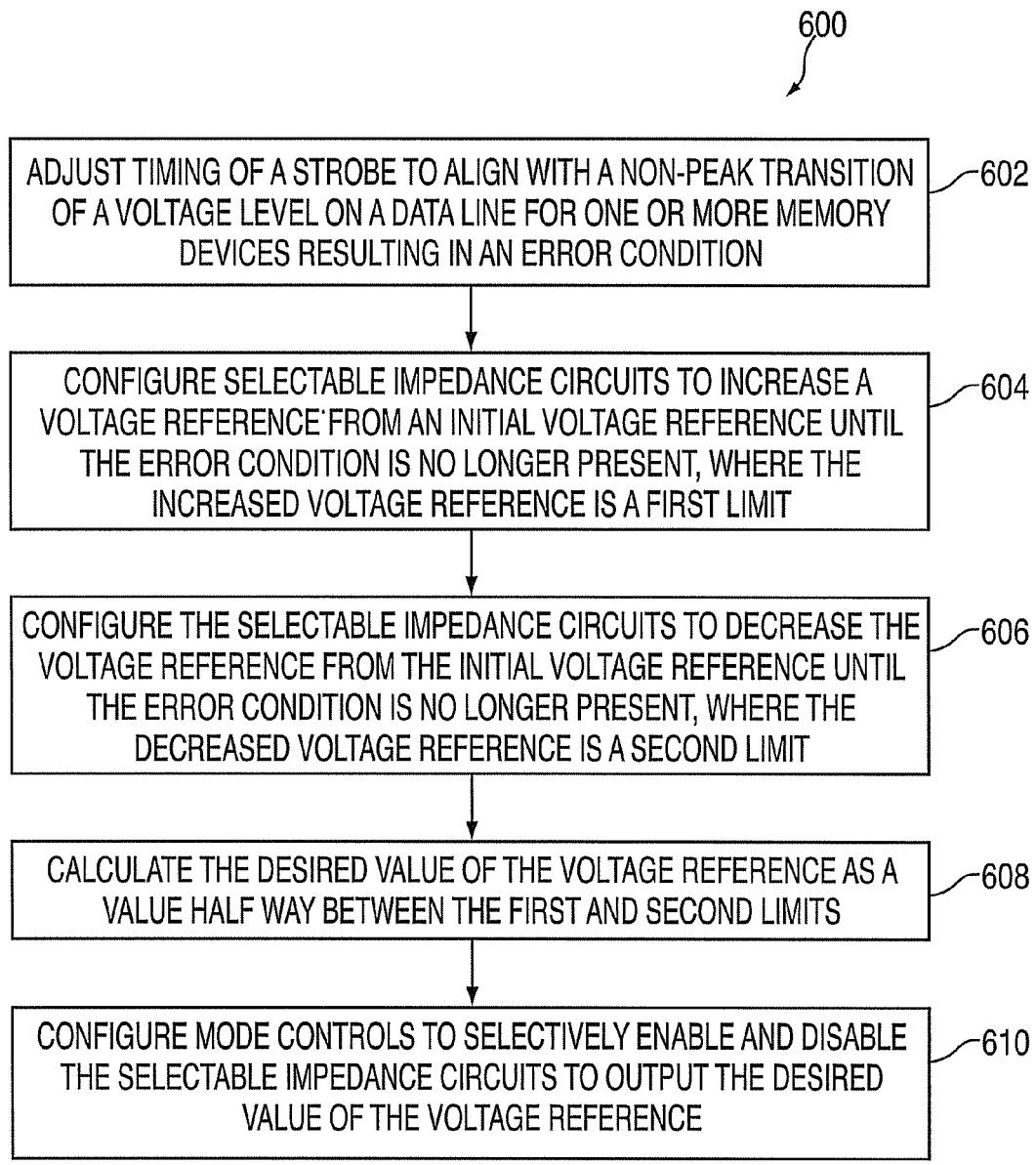
FIG. 6 depicts an exemplary process for controlling a voltage reference driver in a memory system that may be implemented by exemplary embodiments.

FIG. 6 depicts a process 600 for controlling the reference voltage driver 208 in memory system 100 that may be implemented as described in reference to FIGS. 1-5. The memory system 100 can be configured in variety of architectures, e.g., planar or a cascade interconnected DIMMs. A memory interface device, such as the memory device hub 104 or the memory controller 110 can include one or more PHYs 126 to communicate with memory devices, e.g., DRAMs 509. In an exemplary embodiment, the PHYs 126 are configurable to support a variety of memory technologies, such as DDR2, DDR3, DDR3+, DDR4, etc.

In an exemplary embodiment, the control logic 202 determines a desired value of a voltage reference at VREF 216 for one or more memory devices 509 in the memory system 100. The control logic 202 may configure the voltage reference driver 208 to a pre-determined value or can make dynamic adjustments as further described. At block 602, the control logic 202 adjusts timing of one or more of the strobes (DQS 214) via the differential bidirectional driver 206 to align with a non-peak transition of a voltage level on a data line (DQ 212) for one or more memory devices 509 resulting in an error condition. Moving the timing away from a peak level results in sampling DQ 212 at a lower voltage, which can result in errors if the voltage is not consistently above or below a threshold value relative to the voltage at VREF 216 used to determine high/low states.

At block 604, the control logic 202 configures the selectable impedance circuits (P-slices 329 and N-slices 335) of the voltage reference driver 208 to increase the voltage reference at VREF 216 from an initial voltage reference until the error condition is no longer present, where the increased voltage reference is a first limit. This may establish a low voltage limit. When selectively enabling and disabling the P-slices 329 and N-slices 335, a constant impedance is maintained at the voltage reference output node (VREF 216) within a threshold value in response to the configuring. For example, the constant impedance can be 50 Ohms +/−5%. Only enabling combinations where half of all of the P-slices 329 and N-slices 335 are enabled, e.g., various combinations with 16 of 32 total slices enabled, can maintain the constant impedance.

At block 606, the control logic 202 configures the selectable impedance circuits (P-slices 329 and N-slices 335) of the voltage reference driver 208 to decrease the voltage reference at VREF 216 from the initial voltage reference until the error condition is no longer present, where the decreased voltage reference is a second limit. This may establish a high voltage limit.

At block 608, the control logic 202 calculates the desired value of the voltage reference at VREF 216 as a value halfway between the first and second limits. The timing of the strobes (DQS 214) can be reset to align with peak/near-peak values of DQ 212.

At block 610, the control logic 202 configures mode controls 304 and 306 to selectively enable and disable the selectable impedance circuits (P-slices 329 and N-slices 335) to output the desired value of the voltage reference at VREF 216. This re-centers the voltage to an optimized value, which may increase margin and support lowering of the drive voltage (DVDD 328) for DQ 212 to decrease the vertical data eye after the timing of the strobes (DQS 214) is reset.

Figure 7:
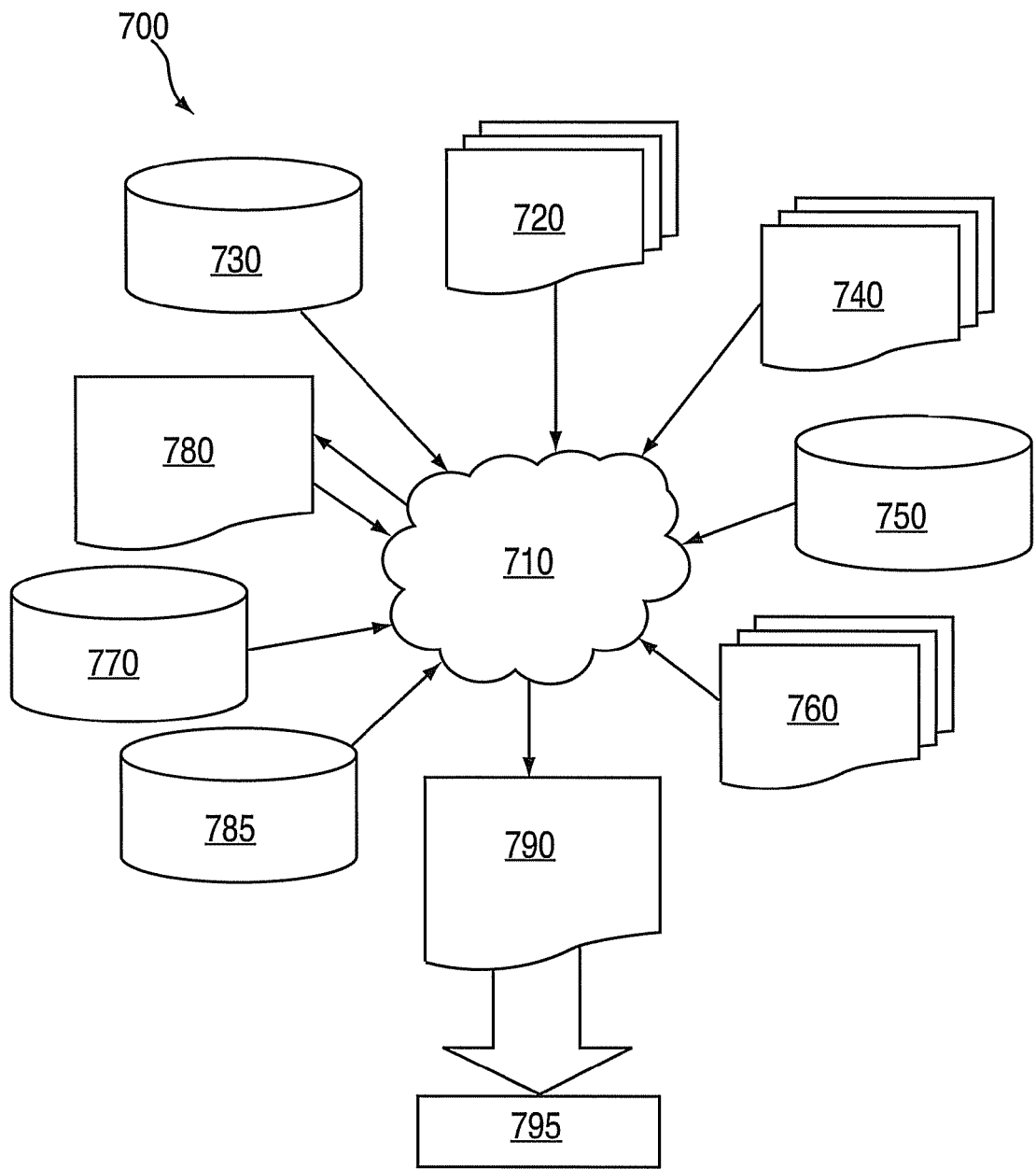
FIG. 7 is a flow diagram of a design process used in semiconductor design, manufacture, and/or test.

FIG. 7 shows a block diagram of an exemplary design flow 700 used for example, in semiconductor IC logic design, simulation, test, layout, and manufacture. Design flow 700 includes processes and mechanisms for processing design structures or devices to generate logically or otherwise functionally equivalent representations of the design structures and/or devices described above and shown in FIGS. 1-6. The design structures processed and/or generated by design flow 700 may be encoded on machine readable transmission or storage media to include data and/or instructions that when executed or otherwise processed on a data processing system generate a logically, structurally, mechanically, or otherwise functionally equivalent representation of hardware components, circuits, devices, or systems. Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a machine-readable data transmission, gate array, or storage medium, design structure 720 may be accessed and processed by one or more hardware and/or software modules within design process 710 to simulate or otherwise functionally represent an electronic component, circuit, electronic or logic module, apparatus, device, or system such as those shown in FIGS. 1-6. As such, design structure 720 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of the components, circuits, devices, or logic structures shown in FIGS. 1-6 to generate a netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 710 may include hardware and software modules for processing a variety of input data structure types including netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-6. In one embodiment, design structure 790 may comprise a compiled, executable HDL simulation model that functionally simulates the devices shown in FIGS. 1-6.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-6. Design structure 790 may then proceed to a stage 795 where, for example, design structure 790: proceeds to tape-out, is released to manufacturing, is released to a mask house, is sent to another design house, is sent back to the customer, etc.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The capabilities of the present invention can be implemented in software, firmware, hardware or some combination thereof.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Exemplary embodiments include a computing system with one or more processors and one or more I/O units (e.g., requestors) interconnected to a memory system that contains a memory controller and one or more memory devices. In exemplary embodiments, the memory system includes a processor or memory controller communicating with one or more hub devices (also referred to as "hub chips") which are attached to one or more ports or channels of the memory controller. The memory controller channels may be operated in parallel, thereby providing an increased data bus width and/or effective bandwidth, operated separately, or a combination therein as determined by the application and/or system design. The hub devices connect and interface to the memory devices either by direct connection (e.g. wires) or by way of one or more intermediate devices such as external buffers, registers, clocking devices, conversion devices, etc. In exemplary embodiments the computer memory system includes a physical memory array comprised of one or more volatile and/or non-volatile storage devices for storing such information as data and instructions. In exemplary embodiments, the hub-based computer memory system has memory devices attached to a communication hub device that is connected to a memory control device (e.g., a memory controller). Also in exemplary embodiments, the hub device is located on a memory module (e.g, a single substrate or assembly that includes two or more hub devices that are cascaded interconnected to each other (and may further connect to another hub device located on another memory module) via the cascade interconnect, daisy chain and/or other memory bus structure.

Hub devices may be connected to the memory controller through a multi-drop or point-to-point bus structure (which may further include a cascade connection to one or more additional hub devices). Memory access requests are transmitted by the memory controller through the bus structure (e.g., the memory bus) to the selected hub(s). In response to receiving the memory access requests, the hub device receives and generally translates and re-drives at least a portion of the received information in the memory access request(s) to the memory devices to initiate such operations as the storing of "write" data from the hub device or to provide "read" data to the hub device. Data read from the memory device(s) is generally encoded into one or more communication packet(s) and transmitted through the memory bus(es) to the memory controller or other requester—although the data may also be used by one or more of the hub devices (e.g. during memory "self-testing") or by another device having access to the hub, such as a service processor, test equipment, etc.

In alternate exemplary embodiments, the memory controller(s) may be integrated together with one or more processor chips and supporting logic, packaged in a discrete chip (commonly called a "northbridge" chip), included in a multi-chip carrier with the one or more processors and/or supporting logic, or packaged in various alternative forms that best match the application/environment. Any of these solutions may or may not employ one or more narrow/high speed links (e.g. memory channels or ports) to connect to one or more hub chips and/or memory devices.

The memory modules may be implemented by a variety of technologies including a dual in-line memory module (DIMM), a single in-line memory module (SIMM), a triple in-line memory module (TRIMM), and quad in-line memory module (QUIMM), various "small" form-factor modules (such as small outline DIMMs (SO DIMMs), micro DIMMs, etc) and/or other memory module or card structures. In general, a DIMM refers to a circuit board which is often comprised primarily of random access memory (RAM) integrated circuits or die on one or both sides of the board, with signal and/or power contacts also on both sides, along one edge of the board that are generally have different functionality that the directly and/or diagonally opposed contacts. This can be contrasted to a SIMM which is similar is composition but having opposed contacts electrically interconnected and therefore providing the same functionality as each other. For TRIMMs and QUIMMs, at least one side of the board includes two rows on contacts, with other board types having contacts on multiple edges of the board (e.g. opposing and/or adjacent edges on the same side of the board), in areas away from the board edge, etc. Contemporary DIMMs includes 168, 184, 240, 276 and various other signal pin or pad counts, whereas past and future memory modules will generally include as few as tens of contacts to hundreds of contacts. In exemplary embodiments described herein, the memory modules may include one, two or more hub devices.

In exemplary embodiments, the memory bus is constructed using point-to-point connections between hub devices and/or a hub device and the memory controller, although other bus structures such as multi-drop busses may also be used. When separate "upstream" and "downstream" (generally unidirectional) busses are utilized (together comprising the memory "bus"), the "downstream" portion of the memory bus, referred to as the downstream bus, may include command, address, data and other operational, initialization or status information being sent to one or more of the hub devices that are downstream of the memory controller. The receiving hub device(s) may simply forward the information to the subsequent hub device(s) via bypass circuitry; receive, interpret and re-drive the information if it is determined by the hub(s) to be targeting a downstream hub device; re-drive some or all of the information without first interpreting the information to determine the intended recipient; or perform a subset or combination of these functions.

The upstream portion of the memory bus, referred to as the upstream bus, returns requested read data and/or error, status or other operational information, and this information may be forwarded to the subsequent hub devices and/or the memory control device(s) via bypass circuitry; be received, interpreted and re-driven if it is determined by the hub(s) to be targeting an upstream hub device and/or memory controller in the processor complex; be re-driven in part or in total without first interpreting the information to determine the intended recipient; or perform a subset or combination of these functions.

In alternate exemplary embodiments, the point-to-point bus includes a switch, re-drive or bypass mechanism which results in the bus information being directed to one of two or more possible hub devices during downstream communication (communication passing from the memory controller to a hub device on a memory module), and which may also direct upstream information (communication from a hub device on a memory module toward the memory controller), often by way of one or more upstream hub devices. Further embodiments include the use of continuity modules, such as those recognized in the art, which, for example, can be placed between the memory controller and a first populated memory module (e.g., a memory module that includes a hub device that is in communication with one or more memory devices), in a cascade interconnect memory system, such that any intermediate module positions between the memory controller and the first populated memory module includes a means by which information passing between the memory controller and the first populated memory module device can be received even if the one or more intermediate module position(s) do not include a hub device. The continuity module(s) may be installed in any module position(s), subject to any bus restrictions, including the first position (closest to the main memory controller, the last position (prior to any included termination) or any intermediate position(s). The use of continuity modules may be especially beneficial in a multi-module cascade interconnect bus structure, where an intermediate hub device on a memory module is removed and replaced by a continuity module, such that the system continues to operate after the removal of the intermediate hub device/module. In more common embodiments, the continuity module(s) would include either interconnect wires to transfer all required signals from the input(s) to the corresponding output(s), or be re-driven through a repeater device. The continuity module(s) might further include a non-volatile storage device (such as an EEPROM), but would not include conventional main memory storage devices such as one or more volatile memory device(s). In other exemplary embodiments, the continuity or re-drive function may be comprised as a hub device that is not placed on a memory module (e.g. the one or more hub device(s) may be attached directly to the system board or attached to another carrier), and may or may not include other devices connected to it to enable functionality.

In exemplary embodiments, the memory system includes one or more hub devices on one or more memory modules connected to the memory controller via one or more cascade interconnect memory buses, however one or more other bus structure(s) or a combination of bus structures may be implemented to enable communication such as point-to-point bus(es), multi-drop bus(es) or other shared or parallel bus(es), often allow various means of communication (e.g. including both high speed and low speed communication means). Depending on the signaling methods used, the intended operating frequency range, space, power, cost, and other constraints, various alternate bus structures may also be considered. A point-to-point bus may provide optimal performance (e.g. maximum data rate) in systems produced with high frequency signaling utilizing electrical interconnections, due to the reduced signal degradation that may occur as compared to bus structures having branched signal lines (such as "T" nets, multi-drop nets or other forms of "stubs". However, when used in systems requiring communication with a large number of devices and/or memory subsystems, this method will often result in significant added component cost, increased latency for distant devices and/or increased system power, and may further reduce the total memory density in a given volume of space due to the need for intermediate buffering and/or re-drive of the bus(es).

Although generally not shown in the Figures, the memory modules or hub devices may also include one or more separate bus(es), such as a "presence detect" (e.g. a module serial presence detect bus), an I2C bus, a JTAG bus, an SMBus or other bus(es) which are primarily used for one or more purposes such as the determination of the hub device an/or memory module attributes (generally after power-up), the configuration of the hub device(s) and/or memory subsystem (s) after power-up or during normal operation, bring-up and/or training of the high speed interfaces (e.g. bus(es)), the reporting of fault or status information to the system and/or testing/monitoring circuitry, the determination of specific failing element(s) and/or implementation of bus repair actions such as bitlane and/or segment sparing, the determination of one or more failing devices (e.g. memory and/or support device(s)) possibly with the invoking of device replacement (e.g. device "sparing"), parallel monitoring of subsystem operation or other purposes, etc. The one or more described buses would generally not be intended for primary use as high speed memory communication bus(es). Depending on the bus characteristics, the one or more bus(es) might, in addition to previously described functions, also provide a means by which the valid completion of operations and/or failure identification could be reported by the hub devices and/or memory module(s) to the memory controller(s), the processor, a service processor, a test device and/or other functional element permanently or temporarily in communication with the memory subsystem and/or hub device.

In other exemplary embodiments, performances similar to those obtained from point-to-point bus structures can be obtained by adding switch devices to the one or more communication bus(es). These and other solutions may offer increased memory packaging density at lower power, while otherwise retaining many of the characteristics of a point-to-point bus. Multi-drop busses provide an alternate solution, albeit often limiting the maximum operating frequency to a frequency lower than that available with the use of an optimized point-to-point bus structure, but at a cost/performance point that may otherwise be acceptable for many applications. Optical bus solutions may permit significantly increased frequency and bandwidth vs. the previously-described bus structures, using point-to-point or multi-drop or related structures, but may incur cost and/or space impacts when using contemporary technologies.

As used herein the term "buffer" or "buffer device" refers to an interface device which includes temporary storage circuitry (such as when used in a computer), especially one that accepts information at one rate (e.g. a high data rate) and delivers it another (e.g. a lower data rate), and vice versa. Data rate multipliers of 2:1, 4:1, 5:1, 6:1, 8:1, etc. may be utilized in systems utilizing one or more buffer device(s) such as those described herein, with such systems often supporting multiple data rate multipliers—generally on a per-port basis. In exemplary embodiments, a buffer is an electronic device that provides compatibility between two signals (e.g. one or more of changing voltage levels, converting data rates, etc.). The term "hub" may be used interchangeably with the term "buffer" in some applications. A hub is generally described as a device containing multiple ports that enable connection to one or more devices on each port. A port is a portion of an interface that serves a congruent I/O functionality (e.g., in the exemplary embodiment, a port may be utilized for sending and receiving information such as data, address, command and control information over one of the point-to-point links (which may further be comprised of one or more bus(es)), thereby enabling communication with one or more memory devices. A hub may further be described as a device that connects several systems, subsystems, or networks together, and may include logic to merge local data into a communication data stream passing through the hub device. A passive hub may simply forward messages, while an active hub, or repeater, may amplify, re-synchronize and/or refresh a stream of data (e.g. data packets) which otherwise would deteriorate in signal quality over a distance. The term hub device, as used herein, refers primarily to one or more active devices that also include logic (including hardware and/or software) for directly and/or indirectly connecting to and communicating with one or more memory device(s) utilizing one communication means to another communication means (e.g. one or more of an upstream and downstream bus and/or other bus structure). The hub device may further include one or more traditional "memory controller" functions such as the conversion of high-level address and/or commands into technology-specific memory device information, scheduling and/or re-ordering of memory operations, the inclusion of local data caching circuitry and/or include other traditional memory controller and/or memory system functions.

Also as used herein, the term "bus" refers to one of the sets of conductors (e.g., wires, printed circuit board traces or other connection means) between devices, cards, modules and/or other functional units. The data bus, address bus and control signals, despite their names, generally constitute a single bus since each are often useless without the others. A bus may include a plurality of signal lines, each signal line having two or more connection points that form a transmission path that enables communication between two or more transceivers, transmitters and/or receivers. The term "channel", as used herein, refers to the one or more busses containing information such as data, address(es), command(s) and control(s) to be sent to and received from a system or subsystem, such as a memory, processor or I/O system. Note that this term is often used in conjunction with I/O or other peripheral equipment; however the term channel has also been utilized to describe the interface between a processor or memory controller and one of one or more memory subsystem(s).

Further, as used herein, the term "daisy chain" refers to a bus wiring structure in which, for example, device A is wired to device B, device B is wired to device C, etc. . . . The last device is typically wired to a resistor or terminator. All devices may receive identical signals or, in contrast to a simple bus, each device may modify, re-drive or otherwise act upon one or more signals before passing them on. A "cascade" or cascade interconnect' as used herein refers to a succession of stages or units or a collection of interconnected networking devices, typically hubs, in which the hubs operate as a logical repeater, further permitting merging data to be concentrated into the existing data stream. The terms daisy chain and cascade connect may be used interchangeably when a daisy chain structure includes some form of re-drive and/or "repeater" function. Also as used herein, the term "point-to-point" bus and/or link refers to one or a plurality of signal lines that may each include one or more terminators. In a point-to-point bus and/or link, each signal line has two transceiver connection points, with each transceiver connection point coupled to transmitter circuitry, receiver circuitry or transceiver circuitry. A signal line refers to one or more electrical conductors, optical carriers and/or other information transfer method, generally configured as a single carrier or as two or more carriers, in a twisted, parallel, or concentric arrangement, used to transport at least one logical signal.

Memory devices are generally defined as integrated circuits that are comprised primarily of memory (storage) cells, such as DRAMs (Dynamic Random Access Memories), SRAMs (Static Random Access Memories), FeRAMs (Ferro-Electric RAMs), MRAMs (Magnetic Random Access Memories), ORAMs (optical random access memories), Flash Memories and other forms of random access and/or pseudo random access storage devices that store information in the form of electrical, optical, magnetic, biological or other means. Dynamic memory device types may include asynchronous memory devices such as FPM DRAMs (Fast Page Mode Dynamic Random Access Memories), EDO (Extended Data Out) DRAMs, BEDO (Burst EDO) DRAMs, SDR (Single Data Rate) Synchronous DRAMs, DDR (Double Data Rate) Synchronous DRAMs, QDR (Quad Data Rate) Synchronous DRAMs, Toggle-mode DRAMs or any of the expected follow-on devices such as DDR2, DDR3, DDR4 and related technologies such as Graphics RAMs, Video RAMs, LP RAMs (Low Power DRAMs) which are often based on at least a subset of the fundamental functions, features and/or interfaces found on related DRAMs.

Memory devices may be utilized in the form of chips (die) and/or single or multi-chip packages of various types and configurations. In multi-chip packages, the memory devices may be packaged with other device types such as other memory devices, logic chips, analog devices and programmable devices, and may also include passive devices such as resistors, capacitors and inductors. These packages may include an integrated heat sink or other cooling enhancements, which may be further attached to the immediate carrier or another nearby carrier or heat removal system.

Module support devices (such as buffers, hubs, hub logic chips, registers, PLL's, DLL's, non-volatile memory, etc) may be comprised of multiple separate chips and/or components, may be combined as multiple separate chips onto one or more substrates, may be combined onto a single package and/or or integrated onto a single device—based on technology, power, space, cost and other tradeoffs. In addition, one or more of the various passive devices such as resistors, capacitors may be integrated into the support chip packages and/or into the substrate, board or raw card itself, based on technology, power, space, cost and other tradeoffs. These packages may also include one or more heat sinks or other cooling enhancements, which may be further attached to the immediate carrier or be part of an integrated heat removal structure that contacts more than one support and/or memory devices.

Memory devices, hubs, buffers, registers, clock devices, passives and other memory support devices and/or components may be attached to the memory subsystem via various methods including solder interconnects, conductive adhesives, socket assemblies, pressure contacts and other methods which enable communication between the two or more devices and/or carriers via electrical, optical or alternate communication means.

The one or more memory modules, memory cards and/or alternate memory subsystem assemblies and/or hub devices may be electrically connected to the memory system, processor complex, computer system or other system environment via one or more methods such as soldered interconnects, connectors, pressure contacts, conductive adhesives, optical interconnects and other communication and power delivery methods. Inter-connection systems may include mating connectors (e.g. male/female connectors), conductive contacts and/or pins on one carrier mating with a compatible male or female connection means, optical connections, pressure contacts (often in conjunction with a retaining mechanism) and/or one or more of various other communication and power delivery methods. The interconnection(s) may be disposed along one or more edges of the memory assembly, may include one or more rows of interconnections and/or be located a distance from an edge of the memory subsystem depending on such application requirements as the connection structure, the number of interconnections required, performance requirements, ease of insertion/removal, reliability, available space/volume, heat transfer/cooling, component size and shape and other related physical, electrical, optical, visual/physical access, etc. Electrical interconnections on contemporary memory modules are often referred to as contacts, pins, tabs, etc. Electrical interconnections on a contemporary electrical connector are often referred to as contacts, pads, pins, pads, etc.

As used herein, the term memory subsystem refers to, but is not limited to one or more memory devices, one or more memory devices and associated interface and/or timing/control circuitry and/or one or more memory devices in conjunction with a memory buffer, hub device, and/or switch. The term memory subsystem may also refer to a storage function within a memory system, comprised of one or more memory devices in addition to one or more supporting interface devices and/or timing/control circuitry and/or one or more memory buffers, hub devices or switches, identification devices, etc.; generally assembled onto one or more substrate(s), card(s), module(s) or other carrier type(s), which may further include additional means for attaching other devices. The memory modules described herein may also be referred to as memory subsystems because they include one or more memory devices and other supporting device(s).

Additional functions that may reside local to the memory subsystem and/or hub device include write and/or read buffers, one or more levels of local memory cache, local pre-fetch logic (allowing for self-initiated pre-fetching of data), data encryption/decryption, compression/de-compression, address and/or command protocol translation, command prioritization logic, voltage and/or level translation, error detection and/or correction circuitry on one or more busses, data scrubbing, local power management circuitry (which may further include status reporting), operational and/or status registers, initialization circuitry, self-test circuitry (testing logic and/or memory in the subsystem), performance monitoring and/or control, one or more co-processors, search engine(s) and other functions that may have previously resided in the processor, memory controller or elsewhere in the memory system. Memory controller functions may also be included in the memory subsystem such that one or more of non-technology-specific commands/command sequences, controls, address information and/or timing relationships can be passed to and from the memory subsystem, with the subsystem completing the conversion, re-ordering, re-timing between the non-memory technology-specific information and the memory technology-specific communication means as necessary. By placing more technology-specific functionality local to the memory subsystem, such benefits as improved performance, increased design flexibility/extendibility, etc., may be obtained, often while making use of unused circuits within the subsystem.

Memory subsystem support device(s) may be directly attached to the same substrate or assembly onto which the memory device(s) are attached, or may be mounted to a separate interposer, substrate, card or other carrier produced using one or more of various plastic, silicon, ceramic or other materials which include electrical, optical or other communication paths to functionally interconnect the support device (s) to the memory device(s) and/or to other elements of the memory subsystem or memory system.

Information transfers (e.g. packets) along a bus, channel, link or other interconnection means may be completed using one or more of many signaling options. These signaling options may include one or more of such means as single-ended, differential, optical or other communication methods, with electrical signaling further including such methods as voltage and/or current signaling using either single or multi-level approaches. Signals may also be modulated using such methods as time or frequency, non-return to zero, phase shift keying, amplitude modulation and others. Signal voltage levels are expected to continue to decrease, with 1.5V, 1.2V, 1V and lower signal voltages expected, as a means of reducing power, accommodating reduced technology breakdown voltages, etc.—in conjunction with or separate from the power supply voltages. One or more power supply voltages, e.g. for DRAM memory devices, may drop at a slower rate that the I/O voltage(s) due in part to the technological challenges of storing information in the dynamic memory cells.

One or more clocking methods may be utilized within the memory subsystem and the memory system itself, including global clocking, source-synchronous clocking, encoded clocking or combinations of these and other methods. The clock signaling may be identical to that of the signal (often referred to as the bus "data") lines themselves, or may utilize one of the listed or alternate methods that is more conducive to the planned clock frequency(ies), and the number of clocks required for various operations within the memory system/subsystem(s). A single clock may be associated with all communication to and from the memory, as well as all clocked functions within the memory subsystem, or multiple clocks may be sourced using one or more methods such as those described earlier. When multiple clocks are used, the functions within the memory subsystem may be associated with a clock that is uniquely sourced to the memory subsystem and/or may be based on a clock that is derived from the clock included as part of the information being transferred to and from the memory subsystem (such as that associated with an encoded clock). Alternately, a unique clock may be used for the information transferred to the memory subsystem, and a separate clock for information sourced from one (or more) of the memory subsystems. The clocks themselves may operate at the same or frequency multiple of the communication or functional frequency, and may be edge-aligned, center-aligned or placed in an alternate timing position relative to the data, command or address information.

Information passing to the memory subsystem(s) will generally be composed of address, command and data, as well as other signals generally associated with requesting or reporting status or error conditions, resetting the memory, completing memory or logic initialization and/or other functional, configuration or related operations. Information passing from the memory subsystem(s) may include any or all of the information passing to the memory subsystem(s), however generally will not include address and command information. The information passing to or from the memory subsystem(s) may be delivered in a manner that is consistent with normal memory device interface specifications (generally parallel in nature); however, all or a portion of the information may be encoded into a 'packet' structure, which may further be consistent with future memory interfaces or delivered using an alternate method to achieve such goals as an increase communication bandwidth, an increase in memory subsystem reliability, a reduction in power and/or to enable the memory subsystem to operate independently of the memory technology. In the latter case, the memory subsystem (e.g. the hub device) would convert and/or schedule, time, etc. the received information into the format required by the receiving device (s).

Initialization of the memory subsystem may be completed via one or more methods, based on the available interface busses, the desired initialization speed, available space, cost/complexity, the subsystem interconnect structures involved, the use of alternate processors (such as a service processor) which may be used for this and other purposes, etc. In one embodiment, the high speed bus may be used to complete the initialization of the memory subsystem(s), generally by first completing a step-by-step training process to establish reliable communication to one, more or all of the memory subsystems, then by interrogation of the attribute or 'presence detect' data associated the one or more various memory assemblies and/or characteristics associated with any given subsystem, and ultimately by programming any/all of the programmable devices within the one or more memory subsystems with operational information establishing the intended operational characteristics for each subsystem within that system. In a cascaded system, communication with the memory subsystem closest to the memory controller would generally be established first, followed by the establishment of reliable communication with subsequent (downstream) subsystems in a sequence consistent with their relative position along the cascade interconnect bus.

A second initialization method would include one in which the high speed bus is operated at one frequency during the initialization process, then at a second (and generally higher) frequency during the normal operation. In this embodiment, it may be possible to initiate communication with any or all of the memory subsystems on the cascade interconnect bus prior to completing the interrogation and/or programming of each subsystem, due to the increased timing margins associated with the lower frequency operation.

A third initialization method might include operation of the cascade interconnect bus at the normal operational frequency (ies), while increasing the number of cycles associated with each address, command and/or data transfer. In one embodiment, a packet containing all or a portion of the address, command and/or data information might be transferred in one clock cycle during normal operation, but the same amount and/or type of information might be transferred over two, three or more cycles during initialization. This initialization process would therefore be using a form of 'slow' commands, rather than 'normal' commands, and this mode might be automatically entered at some point after power-up and/or re-start by each of the subsystems and the memory controller by way of POR (power-on-reset) logic and/or other methods such as a power-on-rest detection via detection of a slow command identifying that function.

A fourth initialization method might utilize a distinct bus, such as a presence detect bus (such as the one defined in U.S. Pat. No. 5,513,135 to Dell et al., of common assignment herewith), an I2C bus (such as defined in published JEDEC standards such as the 168 Pin DIMM family in publication 21-C revision 7R8) and/or the SMBUS, which has been widely utilized and documented in computer systems using such memory modules. This bus might be connected to one or more modules within a memory system in a daisy chain/cascade interconnect, multi-drop or alternate structure, providing an independent means of interrogating memory subsystems, programming each of the one or more memory subsystems to operate within the overall system environment, and adjusting the operational characteristics at other times during the normal system operation based on performance, thermal, configuration or other changes desired or detected in the system environment.

Other methods for initialization can also be used, in conjunction with or independent of those listed. The use of a separate bus, such as described in the fourth embodiment above, also provides an independent means for both initialization and uses other than initialization, such as described in U.S. Pat. No. 6,381,685 to Dell et al., of common assignment herewith, including changes to the subsystem operational characteristics on-the-fly and for the reporting of and response to operational subsystem information such as utilization, temperature data, failure information or other purposes.

With improvements in lithography, better process controls, the use of materials with lower resistance, increased field sizes and other semiconductor processing improvements, increased device circuit density (often in conjunction with increased die sizes) may facilitate increased function on integrated devices as well as the integration of functions previously implemented on separate devices. This integration can serve to improve overall performance of the memory system and/or subsystem(s), as well as provide such system benefits as increased storage density, reduced power, reduced space requirements, lower cost, higher performance and other manufacturer and/or customer benefits. This integration is a natural evolutionary process, and may result in the need for structural changes to the fundamental building blocks associated with systems.

The integrity of the communication path, the data storage contents and all functional operations associated with each element of a memory system or subsystem can be assured, to a high degree, with the use of one or more fault detection and/or correction methods. Any or all of the various elements may include error detection and/or correction methods such as CRC (Cyclic Redundancy Code), EDC (Error Detection and Correction), parity or other encoding/decoding methods suited for this purpose. Further reliability enhancements may include operation re-try (to overcome intermittent faults such as those associated with the transfer of information), the use of one or more alternate or replacement communication paths and/or portions of such paths (e.g. "segments" of end-to-end "bitlanes") between a given memory subsystem and the memory controller to replace failing paths and/or portions of paths, complement-re-complement techniques and/or alternate reliability enhancement methods as used in computer, communication and related systems.

The use of bus termination, on busses ranging from point-to-point links to complex multi-drop structures, is becoming more common consistent with increased performance demands. A wide variety of termination methods can be identified and/or considered, and include the use of such devices as resistors, capacitors, inductors or any combination thereof, with these devices connected between the signal line and a power supply voltage or ground, a termination voltage (such voltage directly sourced to the device(s) or indirectly sourced to the device(s) from a voltage divider, regulator or other means), or another signal. The termination device(s) may be part of a passive or active termination structure, and may reside in one or more positions along one or more of the signal lines, and/or as part of the transmitter and/or receiving device (s). The terminator may be selected to match the impedance of the transmission line, be selected as an alternate impedance to maximize the useable frequency, signal swings, data widths, reduce reflections and/or otherwise improve operating margins within the desired cost, space, power and other system/subsystem limits.

Technical effects include a memory interface device capable of interfacing with a variety of memory devices on a DIMM and/or with registers on RDIMMs with a controllable voltage reference driver in a memory system of a computer system. The voltage reference driver is configurable to establish different voltages while maintaining a nearly constant source impedance. The voltage reference driver can be adjusted in conjunction with other signals, such as data strobes to optimize timing and enable lower voltage data lines. Control logic to configure the voltage reference driver can be implemented in software or firmware to support adjustments with different memory system configurations and/or memory technologies.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Moreover, the use of the terms first, second, etc. do not denote any order or importance, but rather the terms first, second, etc. are used to distinguish one element from another.

What is claimed is:

1. A voltage reference driver comprising:
   a voltage divider circuit with a voltage reference output node to output a voltage between a first voltage and a second voltage;
   a first selectable impedance circuit coupled to a node at the first voltage and further coupled to the voltage reference output node; and
   a second selectable impedance circuit coupled to a node at the second voltage and further coupled to the voltage reference output node, wherein combinations of the first selectable impedance circuit and the second selectable impedance circuit are selectable such that a constant impedance is maintained at the voltage reference output node within a threshold value.

2. The voltage reference driver of claim 1 wherein the voltage divider circuit is comprised of:
   an upward impedance between the voltage reference output node and a voltage node at the first voltage; and
   a downward impedance between the voltage reference output node and a voltage node at the second voltage.

3. The voltage reference driver of claim 2 wherein the upward impedance is equal to the downward impedance, and the first selectable impedance circuit has an impedance equivalent to the impedance of the second selectable impedance circuit.

4. The voltage reference driver of claim 1 further comprising multiple instances of the first selectable impedance circuit coupled to the node at the first voltage and further coupled to the voltage reference output node and an equivalent number of instances of the second selectable impedance circuit coupled to the node at the second voltage and further coupled to the voltage reference output node.

5. The voltage reference driver of claim 4 wherein 16 instances of the first selectable impedance circuit and 16 instances of the second selectable impedance circuit provide voltage adjustments of $\frac{1}{16}$ of the difference between the first voltage and the second voltage while maintaining the constant impedance as 50 Ohms at the voltage reference output node within the threshold value.

6. The voltage reference driver of claim 4 further comprising:
   voltage reference mode selector configurable to select combinations of the first and second selectable impedance circuits in response to mode control inputs.

7. The voltage reference driver of claim 1 further comprising:
   test circuitry to test the voltage reference driver.

8. The voltage reference driver of claim 1 wherein the voltage at the voltage reference output node is adjusted to optimize memory read and write operations in a memory system with respect to one or more strobes.

9. The voltage reference driver of claim 1 wherein the first selectable impedance circuit is comprised of a p-channel field effect transistor (P-FET) coupled to a first polycrystalline silicon resistor, and the second selectable impedance circuit is comprised of one or more n-channel field effect transistors (N-FETs) coupled to a second polycrystalline silicon resistor.

10. The voltage reference driver of claim 1 wherein the first voltage is a digital voltage at a level to drive data lines of one or more memory devices, the second voltage is ground, and the voltage of the voltage reference output node is adjustable up and down from a voltage of half the first voltage.

11. A system comprising:
one or more memory devices;
control logic; and
a memory interface device in communication with the one or more memory devices via a physical interface comprised of a voltage reference driver, the voltage reference driver comprising:
a voltage divider circuit with a voltage reference output node to output a voltage between a first voltage and a second voltage;
a first selectable impedance circuit coupled to a node at the first voltage and further coupled to the voltage reference output node; and
a second selectable impedance circuit coupled to a node at the second voltage and further coupled to the voltage reference output node, wherein combinations of the first selectable impedance circuit and the second selectable impedance circuit are selectable such that a constant impedance is maintained at the voltage reference output node within a threshold value.

12. The system of claim 11 wherein the memory interface device further comprises multiple ports and each port includes the physical interface.

13. The system of claim 11 wherein the one or more memory devices are in communication with the memory interface device via one or more of:
a registered dual in-line memory module; and
a connection on a memory module.

14. The system of claim 11 wherein the physical interface further comprises:
a data bidirectional driver to send and receive data on data lines of the one or more memory devices;
a differential bidirectional driver to strobe data reads and writes on strobe lines of the one or more memory devices, wherein the control logic adjusts the voltage reference driver to output a voltage that optimizes timing of the strobes with respect to voltage of the data lines.

15. The system of claim 14 wherein the first voltage is a digital voltage at a level to drive the data lines, the second voltage is ground, and the voltage of the voltage reference output node is adjustable up and down from a voltage of half the first voltage.

16. A method for controlling a voltage reference driver in a memory system, the method comprising:
determining a desired value of a voltage reference for one or more memory devices in the memory system; and
configuring mode controls to selectively enable and disable a plurality of selectable impedance circuits coupled to a voltage divider circuit, wherein the voltage divider circuit is further coupled to a voltage reference output node to output the voltage reference, and a constant impedance is maintained at the voltage reference output node within a threshold value in response to the configuring.

17. The method of claim 16 wherein determining the desired value of the voltage reference further comprises:
adjusting timing of a strobe to align with a non-peak transition of a voltage level on a data line for one or more memory devices resulting in an error condition;
configuring the selectable impedance circuits to increase the voltage reference from an initial voltage reference until the error condition is no longer present, wherein the increased voltage reference is a first limit;
configuring the selectable impedance circuits to decrease the voltage reference from the initial voltage reference until the error condition is no longer present, wherein the decreased voltage reference is a second limit; and
calculating the desired value of the voltage reference as a value half way between the first and second limits.

18. The method of claim 16 further wherein the selectable impedance circuits are further comprised of P-slices and N-slices, the P-slices selectable to enable parallel impedances between a voltage source and the voltage reference output node, and the N-slices selectable to enable parallel impedances between the voltage reference output node and ground.

19. The method of claim 18 wherein the voltage divider is further comprised of a series of two 125-Ohm impedances with tolerances between the voltage source and the ground, and further wherein the selectable impedance circuits are further comprised of 16 P-slices and 16 N-slices, each with an impedance of 4 kilo-Ohms with tolerances.

20. The method of claim 18 wherein the constant impedance is maintained by only enabling combinations where half of all of the P-slices and N-slices are enabled.

21. A design structure tangibly embodied in a machine-readable medium for designing, manufacturing, or testing an integrated circuit, the design structure comprising:
a voltage divider circuit with a voltage reference output node to output a voltage between a first voltage and a second voltage;
a first selectable impedance circuit coupled to a node at the first voltage and further coupled to the voltage reference output node; and
a second selectable impedance circuit coupled to a node at the second voltage and further coupled to the voltage reference output node, wherein combinations of the first selectable impedance circuit and the second selectable impedance circuit are selectable such that a constant impedance is maintained at the voltage reference output node within a threshold value.

22. The design structure of claim 21, wherein the design structure comprises a netlist.

23. The design structure of claim 21, wherein the design structure resides on storage medium as a data format used for the exchange of layout data of integrated circuits.

24. The design structure of claim 21, wherein the design structure resides in a programmable gate array.

* * * * *